United States Patent
Kedzia et al.

(10) Patent No.: US 8,884,621 B2
(45) Date of Patent: Nov. 11, 2014

(54) METHOD TO GENERATE MAGNETIC FIELDS OF HIGH UNIFORMITY AND COMPENSATION OF EXTERNAL DISPERSED FIELD, AND SYSTEM FOR ITS EMBODIMENT

(75) Inventors: Piotr Kedzia, Poznan (PL); Eugeniusz Szczesniak, Poznan (PL); Tomasz Czechowski, Poznan (PL); Mikolaj Baranowski, Poznan (PL); Jan Jurga, Poznan (PL)

(73) Assignee: Politechnika Poznanska, Poznan (PL)

( * ) Notice: Subject to any disclaimer, the term of this patent is extended or adjusted under 35 U.S.C. 154(b) by 395 days.

(21) Appl. No.: 13/368,984

(22) Filed: Feb. 8, 2012

(65) Prior Publication Data

US 2012/0200295 A1 Aug. 9, 2012

(30) Foreign Application Priority Data

Feb. 9, 2011 (PL) .......................... 393899

(51) Int. Cl.
*G01V 3/00* (2006.01)
*G01R 33/381* (2006.01)
*G01R 33/421* (2006.01)
(52) U.S. Cl.
CPC ............ *G01R 33/421* (2013.01); *G01R 33/381* (2013.01)
USPC ........................................................ 324/318

(58) Field of Classification Search
USPC .................................................. 324/300–322
See application file for complete search history.

(56) References Cited

U.S. PATENT DOCUMENTS

| | | | | |
|---|---|---|---|---|
| 4,945,446 A | * | 7/1990 | Kuroda et al. | 361/146 |
| 5,440,226 A | * | 8/1995 | Blanpain et al. | 324/72 |
| 5,592,091 A | * | 1/1997 | Manabe | 324/320 |
| 5,600,245 A | * | 2/1997 | Yamamoto et al. | 324/318 |
| 5,661,401 A | * | 8/1997 | Ishikawa et al. | 324/320 |
| 6,208,884 B1 | * | 3/2001 | Kumar et al. | 600/409 |
| 6,545,476 B1 | * | 4/2003 | Heid | 324/320 |
| 7,047,059 B2 | * | 5/2006 | Avrin et al. | 600/409 |
| 7,167,004 B1 | * | 1/2007 | Kruip | 324/320 |
| 8,030,926 B2 | * | 10/2011 | Avdievich et al. | 324/318 |

OTHER PUBLICATIONS

Rinard, George A. et al., "Magnet and Gradient Coil System for Low-Field EPR Imaging," Concepts in Magnetic Resonance (Magnetic Resonance Engineering), 2002, vol. 15(1), pp. 51-58.

Epel, Boris et al., "A Versatile High Speed 250-MHz Pulse Imager for Biomedical Applications," Concepts in Magnetic Resonance Part B (Magnetic Resonance Engineering), 2008, vol. 33B(3), pp. 163-176.

* cited by examiner

*Primary Examiner* — Dixomara Vargas
(74) *Attorney, Agent, or Firm* — Oliff PLC

(57) ABSTRACT

A method to generate magnetic fields of high uniformity within the object examined in which two pairs of coils are used in which the current flows in the same direction and sense.

2 Claims, 6 Drawing Sheets

METHOD TO GENERATE MAGNETIC FIELDS OF HIGH UNIFORMITY AND COMPENSATION OF EXTERNAL DISPERSED FIELD, AND SYSTEM FOR ITS EMBODIMENT

BACKGROUND

The present invention relates to a method to generate magnetic fields of high uniformity within the object examined and compensation of external dispersed field, and a system for its embodiment, which method is applicable in magnetic resonance tomography.

The simplest way to generate a uniform magnetic field is with the use of a Helmholtz coil system. However, a uniform field is obtained only in a small region, between the coils. For instance, uniformity of the magnetic field [generated] with the use of such coils having a radius R=1 m will be of the order of ±1000 ppm for a region between the coils $-0.2\,m \le z \le 0.2\,m$. Such uniformity is too low for applications in nuclear magnetic resonance (NMR) tomography or in electron paramagnetic resonance (EPR) tomography. The uniformity of magnetic field which is required in either of the two examination techniques must be in the order of several dozen ppm or lower. A possible way to improve the uniformity of magnetic field within the object examined is by using two pairs of coils having different radiuses and different current flow directions (George A. Rinard et al. *Magnet and Gradient Coil System for Low-Field EPR Imaging*, Conc. Magn. Res. 15 (2002), 51-58). The uniformity of the magnetic field obtained in this case for two pairs of cells having radiuses $R_1$=40.64 cm and $R_2$=19.77 cm, within $-0.075\,m \le z \le 0.075\,m$ was in the order of ±40 ppm. This is a considerable progress, compared with Helmholtz's single coils having a radius of R=40.64 cm, for which uniformity is in the order of ±600 ppm. The above solution enables magnetic fields to be generated with sufficient uniformities, however, a smaller diameter of the second coil narrows the size of the object to be examined which, for the size of human body entails the construction of a large, energy consuming system. Therefore, in the Center for EPR Imaging, Chicago (Epel B, Sundramoorthy S V, Mailer C, Halpern H J, *A versatile high speed 250-MHz pulse imager for biomedical applications*, Concepts in Magnetic Resonance Part B: Magnetic Resonance Engineering. 33B(3):163-176, 2008) a system was built for the examination of small organisms which was resealed twice, compared with the parameters presented in the paper referred to above. In addition, opposite current flow directions in both coil pairs decrease the magnetic field intensity, which involves the use of more power.

Such limitations are not observed in the layout of the coil systems in an electromagnet, which enables very high uniformities of the magnetic field to be obtained within the working space of a magnetic resonance tomograph.

SUMMARY

The present invention relates to a method to determine the positions of the coil system in an electromagnet along the z axis as well as the number of ampere-turns of the same radiuses, enabling the generation of a highly uniform magnetic field within the working space of a tomograph.

Furthermore, the present invention relates to a method to design additional coils with resealed dimensions to enable compensation of the dispersed field outside the electromagnet, while preventing any considerable decrease of the field value inside the tomograph.

The gist of the invention is a method to generate magnetic fields of high uniformity within the object examined, in which two pairs of coils are used in which the current flows in the same direction and sense while the radiuses of the coil pairs are preferably the same.

DETAILED DESCRIPTION

Figure 1:
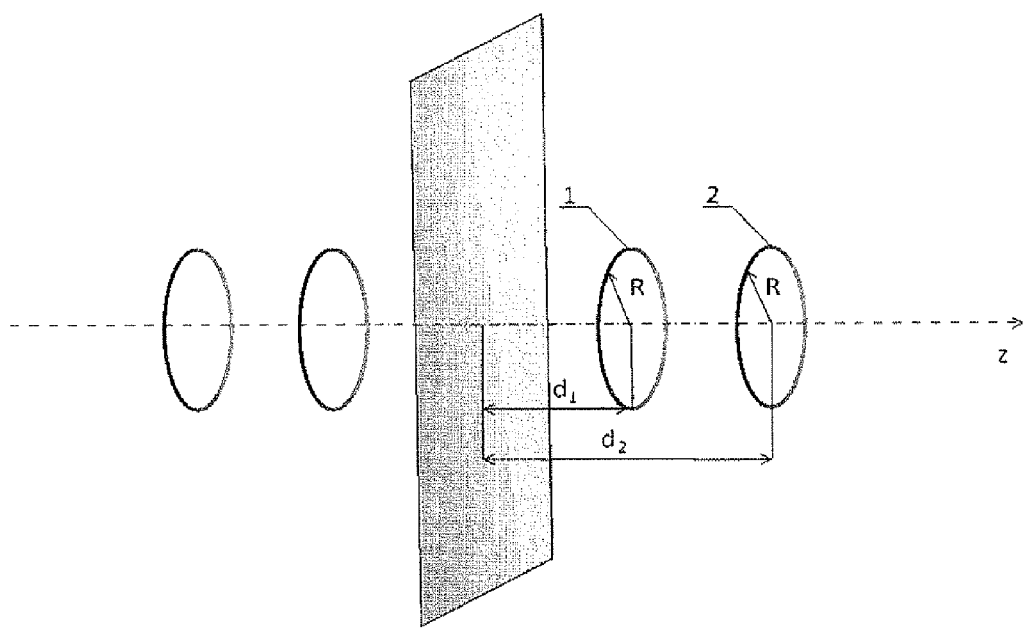
FIG. 1 illustrates the coil geometry of a system with two coil pairs.
Figure 2:
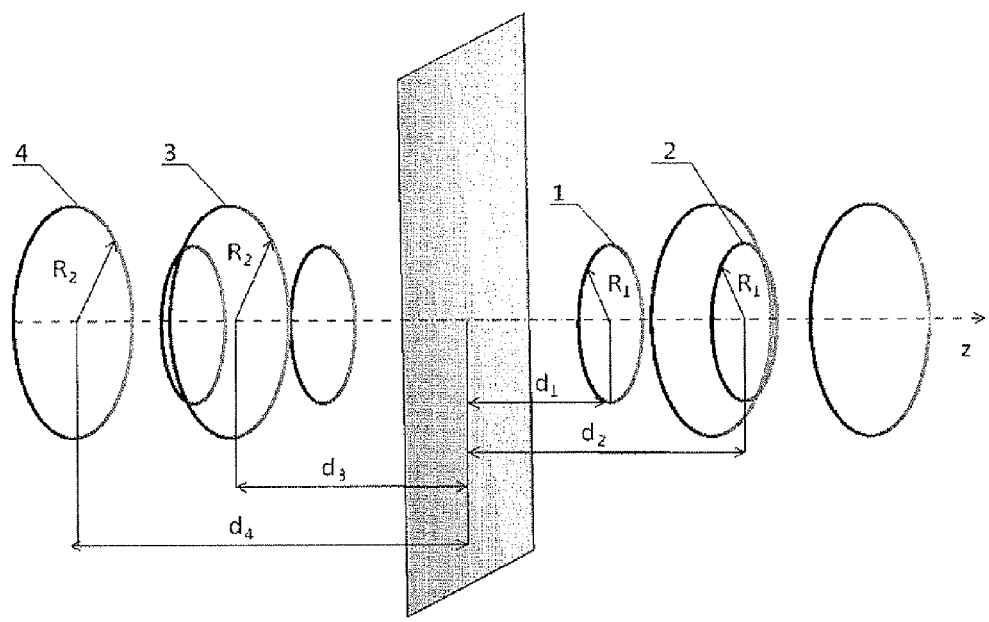
FIG. 2 illustrates the system with a twin system, intended to reduce any residual magnetic field.

Preferably, the distances from the plane of symmetry $d_1$ and $d_2$ for the pair of coils (1) and (2) and the numbers of their ampere-turns are found from the equation system:

$$\frac{d_1}{R} = 0.25153 + 0.06065e^{-t} - 0.00173t - 0.00001t^2$$

$$\frac{d_2}{R} = 0.96173 - 0.06781e^{-t} - 0.00466t + 0.22810te^{-t} + 0.00003t^2$$

$$(NI)_2 / (NI)_1 = 2.12 + 0.02t$$

where $d_1$ is the distance between the first pair of coils and the plane of symmetry, $d_2$ is the distance between the second pair of coils and the plane of symmetry, R is the coil radius, $(NI)_1$ is the ampere-turn size for the first coil, $(NI)_2$ is the ampere-turn size for the second coil, and $1 \le t \le 82$ where t—is a parameter, linearly related to the ratio of ampere-turns for the second coil and that for the first coil.

Also preferably, the distances from the plane of symmetry $d_1$ and $d_2$ for the pair of coils and the numbers of their ampere-turns are found from the equation system:

$$\frac{d_1}{R} = 0.28115 - 0.00004t + 0.00921 \ln t$$

$$\frac{d_2}{R} = 1.11207 + 0.01702t + 3.4 \cdot 10^{-6} t^2 - 0.00263t \ln t$$

$$(NI)_2 / (NI)_1 = 2.12 + 0.02t$$

where $d_1$ is the distance between the first pair of coils and the plane of symmetry, $d_2$ is the distance between the second pair of coils and the plane of symmetry, R is the coil radius, $(NI)_1$ is the ampere-turn size for the first coil, $(NI)_2$ is the ampere-turn size for the second coil, and 1≤t≤394 where t—is a parameter, linearly related to the ratio of ampere-turns for the second coil and that for the first coil.

Also preferably, two additional pairs of coils in which the current flows in the same direction and the radiuses of the coil pairs are preferably the same are used for the compensation of any residual field outside the tomograph.

Furthermore, also preferably, additional two twin-pairs of coils are used for the compensation of any residual field outside the tomograph after resealing their dimensions and ampere-turns according to the equations:

$$\frac{d_1}{R_1} = \frac{d_3}{R_2}$$

$$\frac{d_2}{R_1} = \frac{d_4}{R_2}$$

$$I_{zew} = -I_{wew}\left(\frac{R_1}{R_2}\right)^2$$

where $I_{wew}$ is the current intensity in the inner pair of coils having a radius $R_1$, $I_{zew}$ is the current intensity in the outer pair of coils having a radius $R_2$, $d_1$ is the distance between the first pair of coils and the plane of symmetry, $d_2$ is the distance between the second pair of coils and the plane of symmetry, where $d_3$ is the distance between the first pair of compensating coils and the plane of symmetry, $d_4$ is the distance between the second pair of coils and the plane of symmetry.

In particular, preferably, additional two twin-pairs of coils are used for the compensation of any residual field outside the tomograph after resealing their dimensions and ampere-turns according to the equations.

$$\frac{d_1}{R_1} = \frac{d_3}{R_2}$$

$$\frac{d_2}{R_1} = \frac{d_4}{R_2}$$

$$I_{zew} = -I_{wew}\left(\frac{R_1}{R_2}\right)^2$$

where $I_{wew}$ is the current intensity in the inner pair of coils having a radius $R_1$, $I_{zew}$ is the current intensity in the outer pair of coils having a radius $R_2$, $d_1$ is the distance between the first pair of coils and the plane of symmetry, $d_2$ is the distance between the second pair of coils and the plane of symmetry, where $d_3$ is the distance between the first pair of compensating coils and the plane of symmetry, $d_4$ is the distance between the second pair of coils and the plane of symmetry.

The system, designed to generate magnetic fields of high uniformity within the examined object is characterized by that it is composed of two pairs of coils which, preferably, have the same radiuses, are situated coaxially, are attached to the housing of the tomograph in a permanent, detachable manner, and in which the current flows in the same direction and sense, and that an additional system of two pairs of coils which, preferably, have the same radiuses, are situated coaxially, are attached to the housing of the tomograph in a permanent, detachable manner, and in which the current flows in the same direction and sense, is used for the compensation of any residual field outside the tomograph.

The use of the layout of the coil system of the electromagnet has enabled the following technical and utility effects to be achieved: construction of a system of the principal coils of a tomograph with a facilitated access to the examined objects, generation of highly uniform magnetic fields of which the non-uniformity is in the order of fractions of ppm, reduced power indispensable for operating the tomograph, compensation of any dispersed residual field outside the tomograph. The method of the invention enables unambiguous establishing of all the parameters which are indispensable for the design and manufacture of generating and compensating coils.

The invention is further described in connection with the figures.

Figure 3:
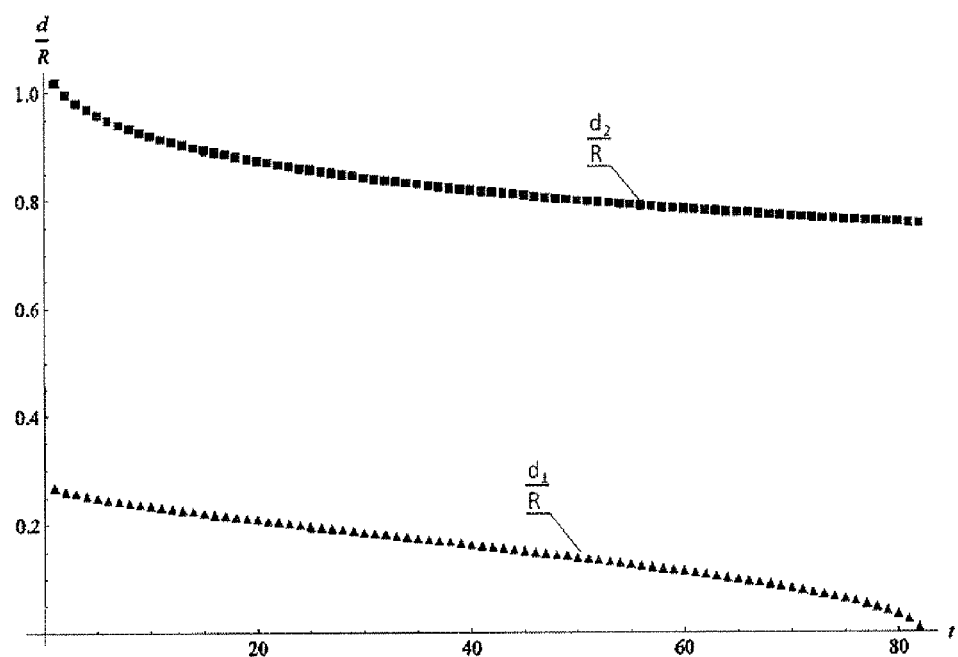
FIG. 3 is a diagram of the value of the distance of two coils from the z axis, with the other two positioned symmetrically about the xy plane, for a first family of solutions that relate to a model in which the coil positions move closer to the plane of symmetry.
Figure 4:
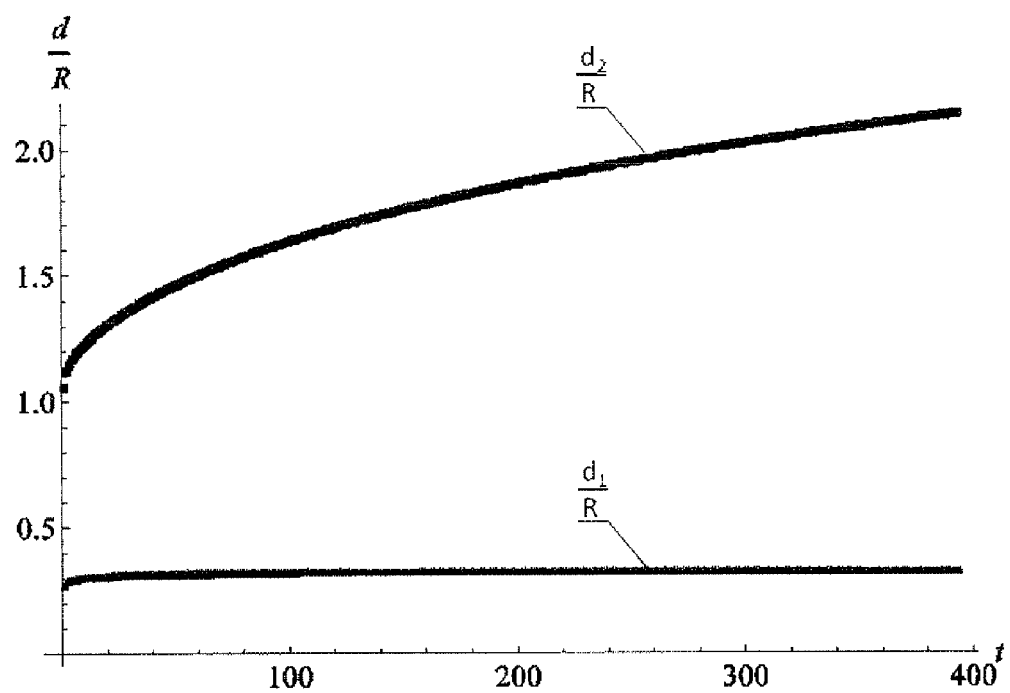
FIG. 4 is a diagram of the value of the distance of two coils from the z axis, with the other two positioned symmetrically about the xy plane, for a second family of solutions that relate to a model in which the coil positions move away from the plane of symmetry.
Figure 5:
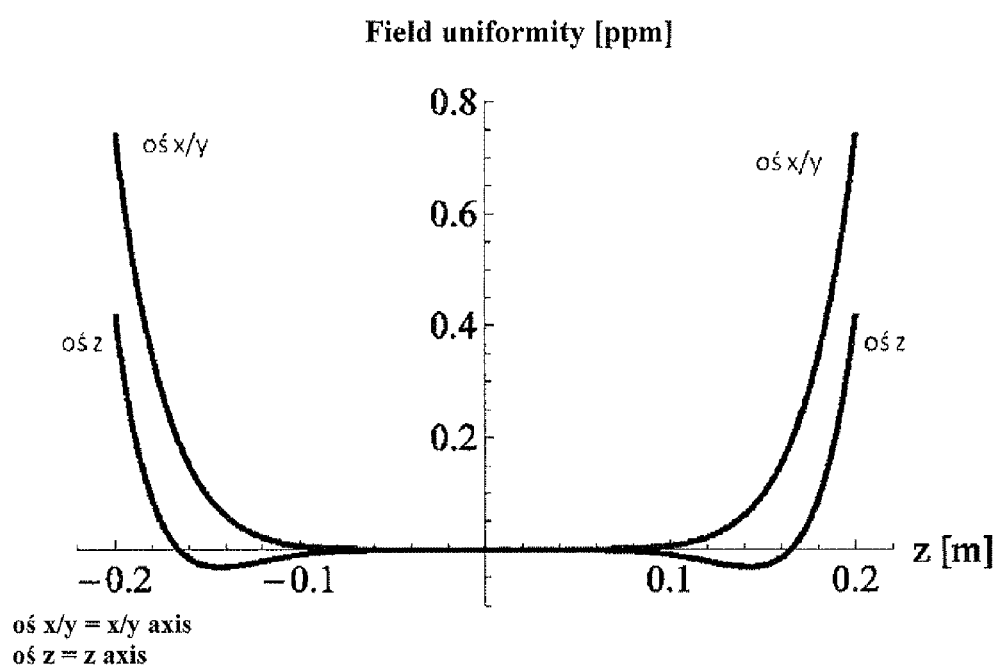
FIG. 5 is a distribution of non-uniformity of magnetic field for a representative configuration.

To generate a uniform magnetic field, a system of two coil pairs is used such that they have same radiuses, their distance from the plane of symmetry is $d_1$ for the nearer pair and $d_2$ for the farther pair, and of which the layout is shown in FIG. 3 for the first case and in FIG. 4 for the second one. For such a system of four coils, there exist two families of solutions, determining the position of each coil pair. The first family of solutions relate to a model in which the coil positions move closer to the plane of symmetry—FIG. 3, the second family are connected with the positions of coil pairs which move away from the plane of symmetry—FIG. 4.

For the first family of solutions, the positions of the coil pairs are found from the following formula:

$$\frac{d_1}{R} = 0.25153 + 0.06065e^{-t} - 0.00173t - 0.00001t^2 \qquad (1)$$

$$\frac{d_2}{R} = 0.96173 - 0.06781e^{-t} - 0.00466t + 0.22810te^{-t} + 0.00003t^2$$

$$(NI)_2/(NI)_1 = 2.12 + 0.02t$$

where $d_1$ is the distance between the first pair of coils and the plane of symmetry, $d_2$ is the distance between the second pair of coils and the plane of symmetry, R is the coil radius, $(NI)_1$ is the ampere-turn size for the first coil, $(NI)_2$ is the ampere-turn size for the second coil, and 1≤t≤82 [where] t—is a parameter, linearly related to the ratio of ampere-turns for the second coil and that for the first coil. The above solutions, described by Equation (1), are related to solutions for the positions of each coil for a compact system. For an open system, where the respective coils move away from each other, the geometric coordinates of the inner coil pair $d_1$ and the coordinates of the outer coil pair $d_2$ should be found using the formula for the second family of solutions:

$$\frac{d_1}{R} = 0.28115 - 0.00004t + 0.00921\ln t \qquad (2)$$

$$\frac{d_2}{R} = 1.11207 + 0.01702t + 3.4 \cdot 10^{-6}t^2 - 0.00263t\ln t$$

$$(NI)_2/(NI)_1 = 2.12 + 0.02t$$

where the parameter 1≤t≤394.

The use of the above formulas enables determination of the positions of both coil pairs, which generate a highly uniform magnetic field of which the uniformity is in the order of ±400 ppb (parts per billion), i.e., a fraction of ppm, within the volume of a sphere of which the radius is 20% of the coil radius, or even as low as ±1 ppb (0.001 ppm) within the volume of a sphere of which the radius is 7% of the coil radius. The obtained uniformity values relate to the region of a cylinder of which the radius is 20% and 7% of the radiuses of powering coils, respectively, while the length of the cylinder is 40% and 14% of the coil radius, respectively. For coils of which the radius is 1 m, the above provides a uniformity region of which the radius is 20 cm and the length is 40 cm.

Compared with the paper quoted, Equations (1) and (2) provide uniformities which are a couple of orders of magnitude higher. Another advantage of designing coil geometry with the use of the algorithms presented herein is that neither transverse nor axial access is limited (in contrast to the smaller diameter of outer coils in the paper quoted). Furthermore, one should be aware of the fact that a magnetic field generated by the proposed coil families is higher (because current flows in the same direction in every coil), compared with the magnetic field generated by the coils proposed by George A. Rinard et al.

Figure 6:
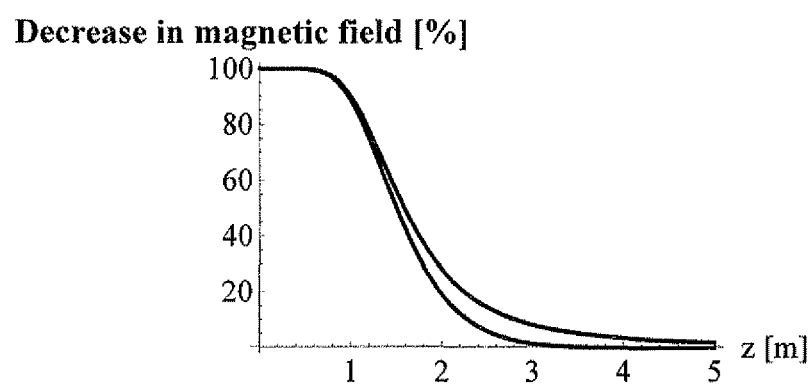
FIG. 6 illustrates the fading value of magnetic field outside the tomograph with and without shielding.

Due to equipment-related problems, no tomograph presently used in EPR imaging has any mechanisms intended to reduce the magnetic field, dispersed outside the tomograph. A commonly used method to eliminate the impact of dispersed magnetic field involved the shielding of rooms. The method of the invention enables a significant reduction of the value of magnetic field outside the coil system, while only negligibly reducing induction of magnetic field inside the system. The method consists in placing one of the proposed coil systems inside a suitable larger (resealed) system. In the system with the larger radius, the current flow will have the same direction but the opposite sense, compared with current in the coil system with the smaller radius. The value of current in the coils with the larger radius is found from the relationship:

$$I_{zew} = -I_{wew}\left(\frac{R_1}{R_2}\right)^2 \quad (3)$$

where $I_{wew}$ is the value of the current which flows in the coils with the smaller radius $R_1$, while $I_{zew}$ is the value of the current which flows in the coils with the larger radius $R_2$. So designed, the system provides the compensation of any residual magnetic field outside the [electro]magnet system according to the exponent $r^{-7}$. FIG. 6 shows the fading of induction of a magnetic field outside the tomograph in the case of two or four coil pairs being used for generating the field.

Application of all of the above advantages of the invention referred to above, connected with the layout of the coil pairs having the same radiuses and current flowing in the same direction, enables significant reductions of operating costs (lower costs of shielding, lower values of current for generating higher values of magnetic fields, small sizes enabling easy access to the inside of the coil system, transverse and axial access to the uniform field region).

What is claimed is:

1. A system, designed to generate magnetic fields of high uniformity within an examined object,
   wherein the system is composed of two pairs of coils, which have the same radiuses, are situated coaxially, are attached to the housing of the tomograph in a permanent, detachable manner, and in which the current flows in the same direction and sense, and
   wherein the distances $d_1$ and $d_2$ from the plane of symmetry for the pairs of coils and the numbers of the ampere-turns for the pairs of coils are found from the equations:

$$\frac{d_1}{R} = 0.25153 + 0.06065e^{-t} - 0.00173t - 0.00001t^2 \quad (a)$$

$$\frac{d_2}{R} = 0.96173 - 0.06781e^{-t} - 0.00466t + 0.22810te^{-t} + 0.00003t^2$$

$$(NI)_2/(NI)_1 = 2.12 + 0.02t$$

or $$\frac{d_1}{R} = 0.28115 - 0.00004t + 0.0092\ln t \quad (b)$$

$$\frac{d_2}{R} = 1.11207 + 0.01702t + 3.4 \cdot 10^{-6}t^2 - 0.00263t\ln t$$

$$(NI)_2/(NI)_1 = 2.12 + 0.02t$$

where $d_1$ is the distance between a first pair of the coils and the plane of symmetry, $d_2$ is the distance between a second pair of the coils and the plane of symmetry, R is a coil radius, $(NI)_1$ is an ampere-turn size for the first coil, $(NI)_2$ is an ampere-turn size for the second coil, and $1 \leq t \leq 82$ for the equation (a) or $1 \leq t \leq 394$ for the equation (b), where t is a parameter, linearly related to the ratio of the ampere-turns of the second coil and the ampere-turns of the first coil.

2. A system according to claim 1, wherein in order to compensate any residual field outside the tomograph, the system additionally includes a set of two compensating coil pairs that have the same radiuses, are situated coaxially, are attached to the housing of the tomograph in a permanent, detachable manner, and in which the current flows in the same direction and sense, and
   wherein the sizes and ampere-turns of the additional two coil pairs are rescaled according to the following equations:

$$\frac{d_1}{R_1} = \frac{d_3}{R_2}$$

$$\frac{d_2}{R_1} = \frac{d_4}{R_2}$$

$$I_{zew} = -I_{wew}\left(\frac{R_1}{R_2}\right)^2$$

where $I_{wew}$ is the current intensity in the inner pair of coils having a radius $R_1$, $I_{zew}$ is the current intensity in the outer pair of coils having a radius $R_2$, $d_3$ is the distance between a first pair of the compensating coils and the plane of symmetry, and $d_4$ is the distance between a second pair of the compensating coils and the plane of symmetry.

* * * * *